United States Patent
Pavloff et al.

(10) Patent No.: US 7,767,064 B2
(45) Date of Patent: Aug. 3, 2010

(54) POSITION CONTROLLED DUAL MAGNETRON

(75) Inventors: Cristopher M. Pavloff, Redwood City, CA (US); Winsor Lam, Daly City, CA (US); Tza-Jing Gung, San Jose, CA (US); Hong S. Yang, Pleasanton, CA (US); Ilyoung Richard Hong, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 913 days.

(21) Appl. No.: 11/553,880

(22) Filed: Oct. 27, 2006

(65) Prior Publication Data

US 2008/0099329 A1    May 1, 2008

(51) Int. Cl.
 *C23C 14/00* (2006.01)
(52) U.S. Cl. .................. 204/192.12; 204/192.15; 204/298.19; 204/298.2
(58) Field of Classification Search ............ 204/298.01, 204/298.19, 298.2, 298.27, 192.12, 192.15, 204/298.17, 298.16
See application file for complete search history.

(56) References Cited

U.S. PATENT DOCUMENTS

| 6,228,236 B1 | 5/2001 | Rosenstein et al. ........ 204/298.2 |
| 2003/0052001 A1* | 3/2003 | Park et al. ............... 204/298.19 |
| 2005/0211548 A1* | 9/2005 | Gung et al. ............. 204/192.12 |
| 2006/0060470 A1 | 3/2006 | Gung .................... 204/298.02 |
| 2006/0076232 A1 | 4/2006 | Miller et al. ........... 204/192.12 |

* cited by examiner

*Primary Examiner*—Nam X Nguyen
*Assistant Examiner*—John Brayton
(74) *Attorney, Agent, or Firm*—Law Offices of Charles Guenzer (57) ABSTRACT

A dual magnetron for plasma sputtering including a source magnetron and an auxiliary magnetron, each of which rotate about the center of the target at respective radii. The positions of the magnetron can be moved in complementary radial directions between sputter deposition and target cleaning. The magnetrons have different characteristics of size, strength, and imbalance. The source magnetron is smaller, stronger, and unbalanced source magnetron and is positioned near the edge of the wafer in sputter deposition and etching. The auxiliary magnetron is larger, weak, and more balanced and used for cleaning the center of the target and guiding sputter ions from the source magnetron in sputter deposition. Each magnetron may have its plasma shorted out in its radially outer position.

25 Claims, 5 Drawing Sheets

POSITION CONTROLLED DUAL MAGNETRON

FIELD OF THE INVENTION

The invention relates generally to sputtering of materials. In particular, the invention relates to the magnetron used in plasma sputtering.

BACKGROUND ART

Sputtering, alternatively called physical vapor deposition (PVD), is the most prevalent method of depositing layers of metals and related materials in the fabrication of semiconductor integrated circuits. Sputtering was largely developed to sputter deposit planar layers of aluminum metallization for electrical contacts. However, in recent years, advanced integrated circuits have increasingly used copper metallization applied by electrochemical plating (ECP) but have also relied upon sputtering for the deposition of thin conformal liner layers in high aspect-ratio holes including barrier layers such as Ta/TaN and copper seed layers for the later applied ECP copper.

Sputtering thin layers into deep holes such as vias has required that a large fraction of the sputtered atoms sputtered from the target be ionized and that the wafer be electrically biased to attract the ions deep within the hole. In a widely used approach, a small magnetron is rotated about the target center near its periphery to project a strong magnetic field adjacent the sputtering face of the target to create a high-density plasma, which not only increases the sputtering rate but also produces a high fraction of ionized sputter particles. Even though the magnetron is located away from the target center, the ions tend to diffuse towards the center and sputter deposit across the entire wafer. In fact, unless other precautions are taken, the sputter deposition tends to be heavier at the wafer center than at the wafer edge because of edge loss of ions to the chamber walls.

The small peripherally located magnetron, however, suffers from the problem that a substantial fraction of the sputtered atoms redeposit on areas of the target that are not being sputtered. The redeposited material at the target center is not subjected to further sputtering and forms a thickening films which does not adhere well to the underlying target. At some point, the redeposited film flakes off the target and generates an excessive number of particles within the chamber. Such particles tend to fall on the wafer being processed and create defects in the resultant integrated circuit with a resulting loss in yield or degraded device reliability. As a result, it has become common practice to occasionally clean the target. In the cleaning mode, usually with production wafers absent from the sputtering chamber, the sputtering conditions are modified so that the center of the target is sputtered to remove the sputter material redeposited there.

The known cleaning techniques have been complicated by the shrinking size of the peripherally located magnetrons and increasing size of the central area of the target requiring cleaning. Any solution, however, should not incur a great increase in chamber complexity or cost or impact system productivity by an excessive cleaning time.

SUMMARY OF THE INVENTION

One aspect of the invention includes two magnetrons both rotating in back of a sputtering target at different variable radii. The magnetrons may differ in size, strength, and imbalance.

A source magnetron is relatively small, strong, and unbalanced and is rotated near the periphery of the target during sputter deposition and sputter etching. An auxiliary magnetron is relatively larger, weaker, and less unbalanced and is rotated over a large portion of the central area of the target during target cleaning.

The source magnetron is located at a respective radially inner position but near the target periphery during sputter deposition and at a radially outer position adjacent the chamber wall during target cleaning, at which time its plasma is suppressed or shorted out. The auxiliary magnetron is located at a respective radially inner position overlying regions close to the target center during target cleaning and is located at a radially outer position near the chamber wall during sputter deposition, at which time its plasma is preferably suppressed or shorted out. The two magnetrons move in complementary radial directions. A production wafer is located in opposition to the target during sputter deposition but not during target cleaning.

The two magnetrons may be supported on a swing member supported on an arm rotated about the chamber central axis with the swing member pivoting about a pivot axis displaced from the central axis. The two magnetrons may be located on opposite sides of the arm and two similarly placed bumpers engaging the arm limit the pivoting motion.

DETAILED DESCRIPTION OF THE PREFERRED EMBODIMENTS

The invention modifies a conventional magnetron sputter reactor to include multiple dissimilar magnetrons which may be shifted in complementary radial directions about the rotation center to provide increased control of different phases of a sputtering process including sputter depositing or sputter etching and target cleaning.

Figure 1:
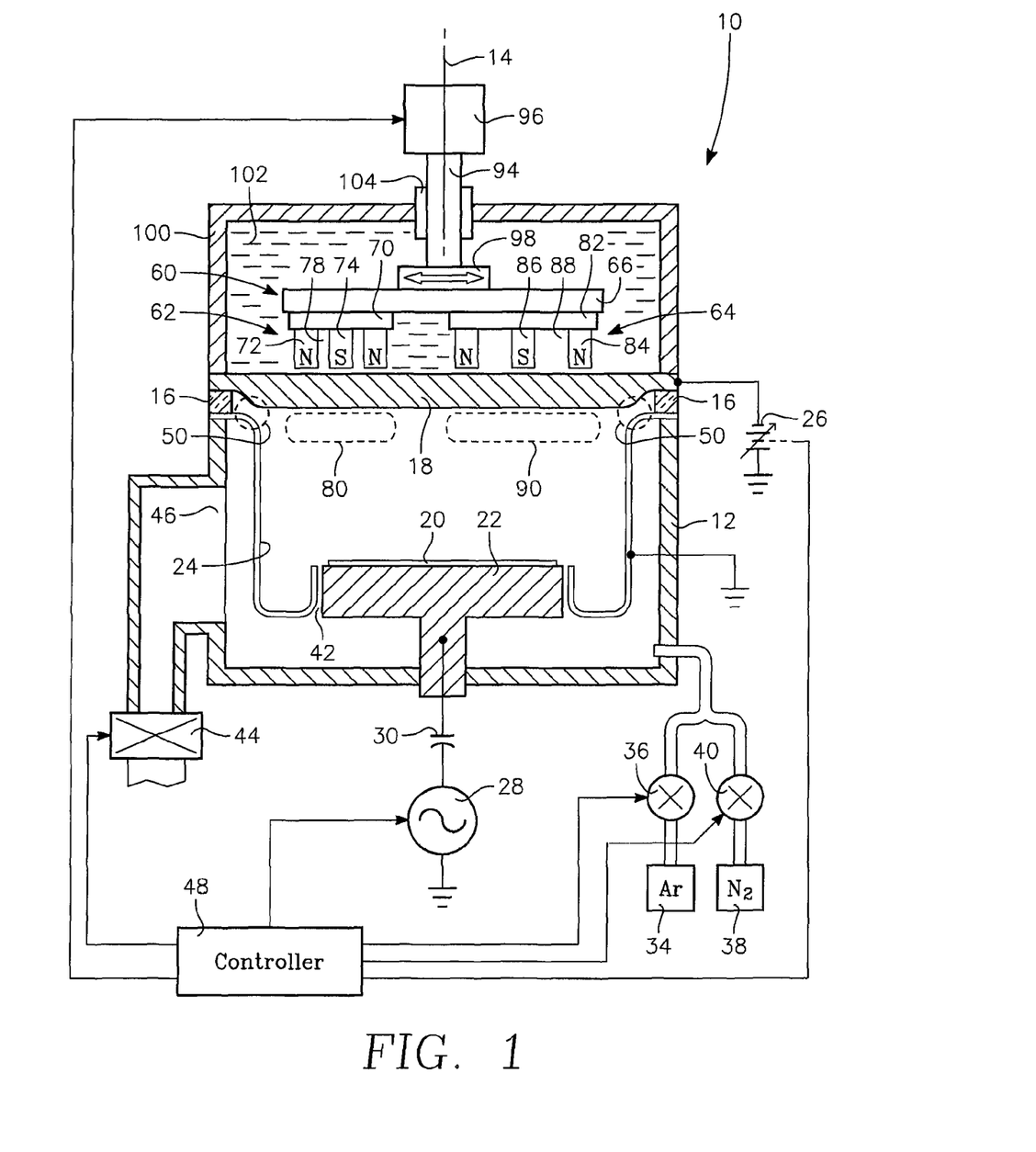
FIG. 1 is a cross-sectional view of a plasma sputter chamber incorporating a dual magnetron of the invention.

A PVD or sputter chamber 10 is illustrated schematically in cross section in FIG. 1. The illustration is based upon the Endura PVD sputter system available from Applied Materials, Inc. of Santa Clara, Calif. The sputter chamber 10 includes a vacuum chamber 12 arranged around a central axis 14 and sealed through a ceramic isolator 16 to a sputter target 18 composed of the material, usually a metal, to be sputter deposited on a wafer 20 or other substrate held on a heater electrode pedestal 22 by an electrostatic chuck or an unillustrated wafer clamp. The target material may be aluminum, copper, aluminum, titanium, tantalum, alloys of these metals containing a few percentages of an alloying element, or other metals amenable to DC sputtering. An electrically grounded shield 24 held within the chamber protects the walls of the vacuum chamber 12 from the sputtered material and provides the anode grounding plane. A selectable and controllable DC power supply 26 negatively biases the target 18 to about −600VDC with respect to the shield 24. The pedestal 22 and hence the wafer 20 may be left electrically floating, but for some types of sputtering, an RF power supply 28 is coupled to the pedestal 22 through an AC capacitive coupling circuit 30 or more complex matching and isolation circuitry to allow the electrode pedestal 22 to develop a DC self-bias voltage, which attracts deep into a high aspect-ratio holes positively charged sputter ions created in a high-density plasma. Even when the pedestal 22 is left electrically floating, it develops some DC self-bias.

A sputter gas source 34 supplies a sputtering working gas, typically argon, to the chamber 12 through a mass flow controller 36. In reactive metallic nitride sputtering, for example, of titanium nitride or tantalum nitride, nitrogen is supplied from a reactive gas source 38 through its own mass flow controller 40. Oxygen can also be supplied to produce oxides such as $Al_2O_3$. The gases can be admitted from various positions within the chamber 12 including from near the bottom, as illustrated, with one or more inlet pipes supplying gas at the back of the shield 24. The gas penetrates through an aperture at the bottom of the shield 24 or through a gap 42 formed between the pedestal 22 and the shield 24. A vacuum pumping system 44 connected to the chamber 12 through a wide pumping port 46 maintains the interior of the chamber 12 at a low pressure. Although the base pressure can be held to about $10^{-7}$ Torr or even lower, the conventional pressure of the argon working gas is typically maintained at between about 1 and 1000 mTorr. However, for semi-ionized sputtering, the pressure may be somewhat lower, for example, down to 0.1 mTorr. For sustained self-sputtering (SSS) once the plasma has been ignited, the supply of argon may be stopped, and the chamber pressure may be made very low. A computer-based controller 48 controls the reactor including the DC power supply 26 and the mass flow controllers 36, 40.

When the argon is admitted into the chamber, the DC voltage between the target 18 and the shield 24 ignites the argon into a plasma. It is noted that the separation in a plasma dark space region 50 between the lower periphery of the target and the grounded shield 24 is kept below a minimum distance which will support a plasma, so that the shield 24 does not short out the biased target 18 through the plasma. Within the plasma dark space region 50, there is a high electric field but substantially no charged plasma particles to conduct the current across the plasma dark space.

The positively charged argon ions excited in the plasma are attracted to the negatively biased target 18 and are accelerated to a substantial energy sufficient that when striking the target they cause target atoms to be sputtered from the target 18. Some of the target particles strike the wafer 20 and are thereby deposited on it, thereby forming a film of the target material. In reactive sputtering of a metallic nitride, nitrogen is additionally admitted into the chamber 12, and it reacts with the sputtered metallic atoms to form a metallic nitride on the wafer 20.

To provide efficient sputtering, a magnetron system 60 is positioned in back of the target 18 to create a magnetic field inside the vacuum chamber adjacent the sputtering surface of the target. The magnetic field can trap electrons and hence ions also to thereby increase the plasma density and to thereby also increase the sputtering rate. According to one embodiment of the invention, the magnetron system 60 includes a source magnetron 62 and an auxiliary magnetron 64 both supported at different positions of a rotation arm 66 relative to the central axis 14 of the chamber 12. The two magnetrons 62, 64 have similar but nonetheless different structures and under proper control achieve different effects. The source magnetron 62 includes a magnetic yoke 70 fixed to the rotation arm 66 at a first radial position and supporting and magnetically coupling an outer pole 72 of a first magnetic polarity in the vertical direction and an inner pole 74 a second magnetic polarity opposite that of the first magnetic polarity, surrounded by the outer pole 72 and separated from it by a gap 78 formed in a closed ring. The magnetic field extending between the two poles 72, 74 creates a source high-density plasma region 80 adjacent a first portion of the sputtering face of the target 18. The source high-density plasma region 80 forms in the shape of a closed plasma track or loop following the shape of the gap 78, which prevents end loss of the plasma. Similarly, the auxiliary magnetron 64 includes a magnetic yoke 82 fixed to the rotation arm 66 at a second radial position and supporting and magnetically coupling an outer pole 84 of preferably the first magnetic polarity and an inner pole 86 of the opposed magnetic polarity, surrounded by the outer pole 84, and separated from it by a gap 88 formed in another closed ring. The magnetic field extending between the two poles 84, 86 creates an auxiliary high-density plasma region 90 adjacent a second portion of the sputtering face of the target 18. The auxiliary high-density plasma region 90 is formed in the shape of another closed plasma track or loop in the shape of the gap 88, which similarly prevents plasma end loss. The plasma loops in the two high-density plasma regions 80, 90 are widely separated and operate largely independently of each other. Importantly, as will be discussed later, one plasma loop may be excited while the other is extinguished.

A rotary shaft 94 powered by a motor 96 extends along the central axis 14 supports a radial shifting mechanism 98, which supports beneath it the rotation arm 66 and the two magnetrons 62, 64. Thereby, the radial shifting mechanism 98 moves the two magnetrons 62, 64 in complementary radial directions, that is, one moves radially toward the central axis 14 while the other moves radially out from it. The two radii need not occupy a common diameter.

Sputtering significantly heats the target 18. Accordingly, a back chamber 100 is sealed to the back of the target 18 and is filled with a liquid bath 102 of cooling water, which is chilled by an unillustrated chiller and water piping recirculating the cooling water. The rotary shaft 94 penetrates the back chamber 100 through a rotary seal 104. The magnetron system 60 including the radial shifting mechanism 98 is immersed in the liquid bath 102.

The source magnetron 62 is small, strong, and unbalanced. The size can be defined as the area encompassed by the outer periphery of the outer pole 72. The imbalance is defined as the ratio of the total magnetic intensity or magnetic flux integrated over the outer pole 72 divided by the total magnetic intensity or magnetic flux integrated over the inner pole 74. The imbalance is substantially larger than one, for example, by a factor of four or more. The magnetic imbalance causes part of the magnetic field emanating from the outer pole 72 to project towards the wafer 20 and guide ionized sputter particles to the wafer 20. Because the source magnetron 62 is small it concentrates the power applied to the target 18 in the area underlying the source magnetron 62. That is, the power density is increased. The strength of the source magnetron 62 creates a higher density plasma. Part of the strength is inversely related to the width of the gap 78. As a result, the target 18 is strongly sputtered in the area of the source magnetron 62 and the high density plasma causes a sizable fraction of the sputtered particles to be ionized. The ionized particles are guided to the wafer 20 by the unbalanced magnetic field.

On the other hand, the auxiliary magnetron 64 is relatively larger and may be less unbalanced than the source magnetron 62. Typically, its size is larger and its gap 88 is wider than the gap 78 of the source magnetron 62.

It has been found that the uniformity of sputter deposition from such a magnetron is improved if the source magnetron 62 is positioned on a radially outer portion of the target 18 since the ion diffusion and the magnetic guiding field tend to push the sputter ions towards the central axis 14. However, if the principal sputtering is occurring in an outer circumferential band of the target 18, some of the sputtered target atoms are likely to redeposit on inner portions of the target 18 within the sputtered band. Because there is very little sputtering otherwise occurring away from the source magnetron 62, the redeposited material is likely to build up into a thickening layer of loosely bonded material. If the redeposited film grows sufficiently thick, it is likely to flake off and create significant particles, thereby degrading the quality of the film deposited on the wafer 20 and any devices formed near the particles falling from the middle of the target 18.

Miller et al. in U.S. patent application Ser. No. 11/226,858, filed Sep. 14, 2005, published as U.S. application publication 2006/0076232, and incorporated herein by reference recognize the need to occasionally clean the inner portions of the target by moving their source magnetron in towards the center of the target during a cleaning mode. Their primary embodiment relies upon centrifugal force and variable rotation speed to change a mechanically biased source magnetron between two radial positions. However, such centrifugal actuation is not easily adapted to clean of the very center of the target both because of the difficulty of moving the magnetron to overlie the center and because the very small size of the source magnetron may be insufficient at another radial position to clean the redeposited central area. Miller et al. also suggest some apparatus for actively moving the source magnetron across the wafer radius. Although possible, such active control is difficult to implement and maintain. Rosenstein et al. in U.S. Pat. No. 6,228,236 addressed a related problem in which the source magnetron primarily sputtered the central portion of the wafer but could be moved to clean the outer portion. Their apparatus depended upon a reversible rotary motion and a secondary free rotation arm acted upon by the hydraulic or hydrodynamic drag to change the rotation arm and the supported magnetron between two radial positions. Again, however, such a mechanism is ill adapted to a small source magnetron cleaning the very center and very edge of the target. Gung, one of the present inventors, discloses two radially stationary magnetrons of different sizes in U.S. patent application Ser. No. 10/949,829, filed Sep. 23, 2004 and now published as U.S. patent application publication 2006/0060470, incorporated herein by reference. He describes exciting only the smaller of the two magnetrons during sputter deposition by reducing the chamber pressure below the minimum pressure at which the larger magnetron supports a plasma. However, such pressure switching has been found ineffective at the higher chamber pressures used in nitride reactive sputtering.

According to one aspect of the invention, the auxiliary magnetron 64, which is relatively large compared to the source magnetron 62, is used to clean the center of the target 18. However, it is desired to extinguish the plasma of the auxiliary magnetron 64 during the principal sputtering operation. Accordingly, as illustrated in the process flow diagram of FIG. 2, in step 110, the source magnetron 62 is moved radially inwardly to a process radius at which the target 18 is sputtered for sputter deposition and the auxiliary magnetron 64 is moved radially outwardly. However, even at its inward position, the source magnetron 62 is positioned generally over an outer portion of the wafer 20. At the outer position of the auxiliary magnetron 94, its plasma track intercepts the plasma dark space 50 and is electrically shorted by it or perhaps grounds out directly to the grounded shield 24. In either case, the excess plasma loss in the auxiliary high-density plasma region 90 is sufficient under the sputtering conditions to prevent the maintenance of an auxiliary plasma in the outer position of the auxiliary magnetron 64. With the magnetrons 62, 64 so positioned, in step 112, the target 18 is sputtered in the area of the source magnetron 62, which is sufficiently removed from the plasma dark space 50 to prevent being extinguished. It is noted that depending upon processing conditions, the target sputter step 112, the wafer 20 may be sputter etched rather than sputter deposited. One or more wafers 20 may be processed during step 112.

Figure 2:
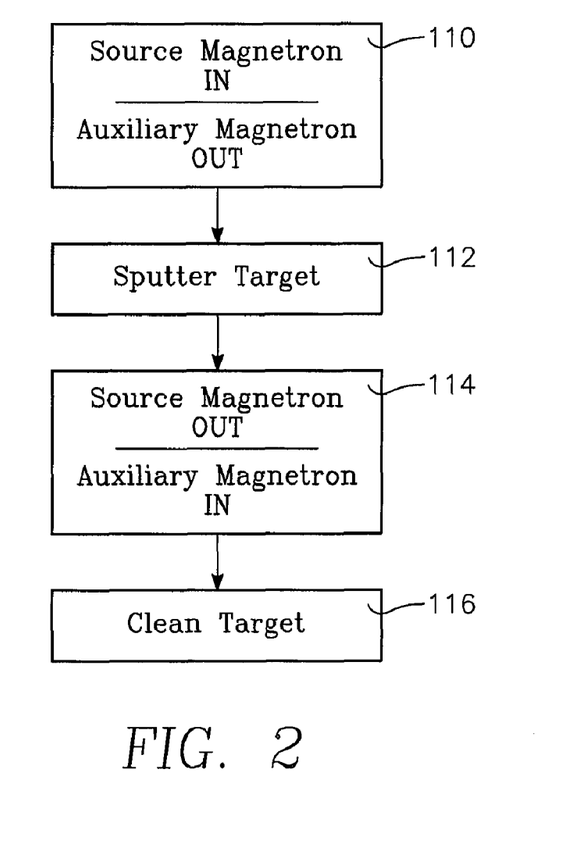
FIG. 2 is flow diagram of a sputtering process included within the invention.

At some point, the redeposited material builds up in the center of the target 18 and needs removal. In step 114, the source magnetron 62 is moved outwardly so that its plasma track is now drained through the plasma dark space 50 and directly grounded to the grounded shield 24. On the other hand, the auxiliary magnetron 64 is moved inwardly away from the plasma dark space 50 and towards the center 14 of the target including all areas needing cleaning. With the magnetrons 62, 64 so repositioned, in step 116, the target 18 is cleaned preferably with no production wafer in the processing chamber. Even under high target power, the source magnetron 62 cannot support a plasma so all the target power is delivered to the cleaning plasma.

A radial throw of about ¾" (2 cm) has been found sufficient to extinguish the plasma associated with one or the other of the two magnetrons.

Figure 3:
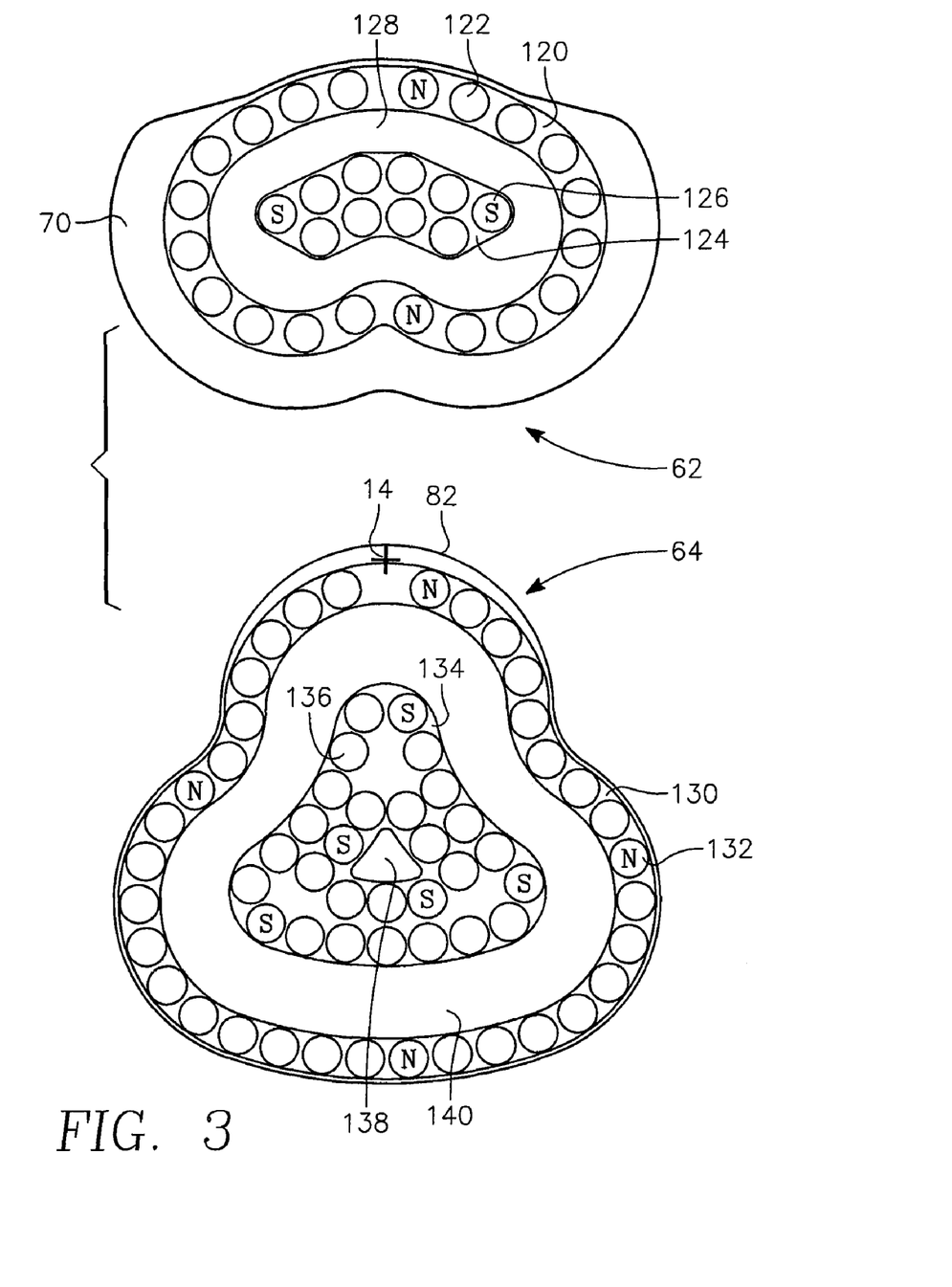
FIG. 3 is an plan view of the source and auxiliary magnetrons in one embodiment of the dual magnetron of the invention.

The invention has been verified using the magnetron illustrated in the bottom plan view of FIG. 3. The source magnetron 62 of this embodiment maybe an LDR magnetron described by Miller et al. in the aforecited patent application. Its outer pole includes an annular pole piece 120 underlain by twenty cylindrical magnets 122 of the first magnetic polarity, N as illustrated, arranged as a single row beneath the pole piece 120. Its inner pole includes an arc-shaped pole piece 124 underlain by ten magnets 126 of the second magnetic polarity, S as illustrated, arranged in two close-packed rows. The source magnetron is magnetically unbalanced by a factor of 2:1. The pole pieces 120, 124 are separated by a closed gap 128 of substantially constant width. The magnets 122, 126 are captured between the pole pieces 120, 124 and the magnetic support yoke 70. The arc-shaped portions of the pole pieces 120, 124 and hence of portions of the gap 128 tend to follow rotation circles about the central axis 14 with a substantial separation of the of the gap 128, defining the plasma loop, from the rotation center 14. The outer pole of the auxiliary magnetron 64 includes an annular outer pole piece 130 underlain by thirty-four magnets 132 of the first magnetic polarity and arranged in continuously and gently curving generally triangular shape with its apex near the rotation axis 14. Its inner pole includes an inner pole piece 134 underlain by twenty-eight magnets 136 of the second magnetic polarity arranged in double rows. The auxiliary magnetron 64 is somewhat magnetically unbalanced by a factor of 17:14 but less than the source magnetron. The inner pole piece 134 has the same continuously and gently curving generally triangular shape with an interior aperture 138 and separated from the outer pole piece 130 by a closed gap 140 of nearly constant width greater than that of the gap 128 of the source magnetron 62. The auxiliary magnetron 62 is larger than the source magnetron 62, is less unbalanced and generally produces a reduced magnetic field density because of the increased width of the gap 140. In one embodiment, the two magnetrons 62, 64 maintain the illustrated separation and orientation, but the position of the rotation center 14 moves towards one or the other magnetron 62, 64 during changes of operational mode.

Figure 4:
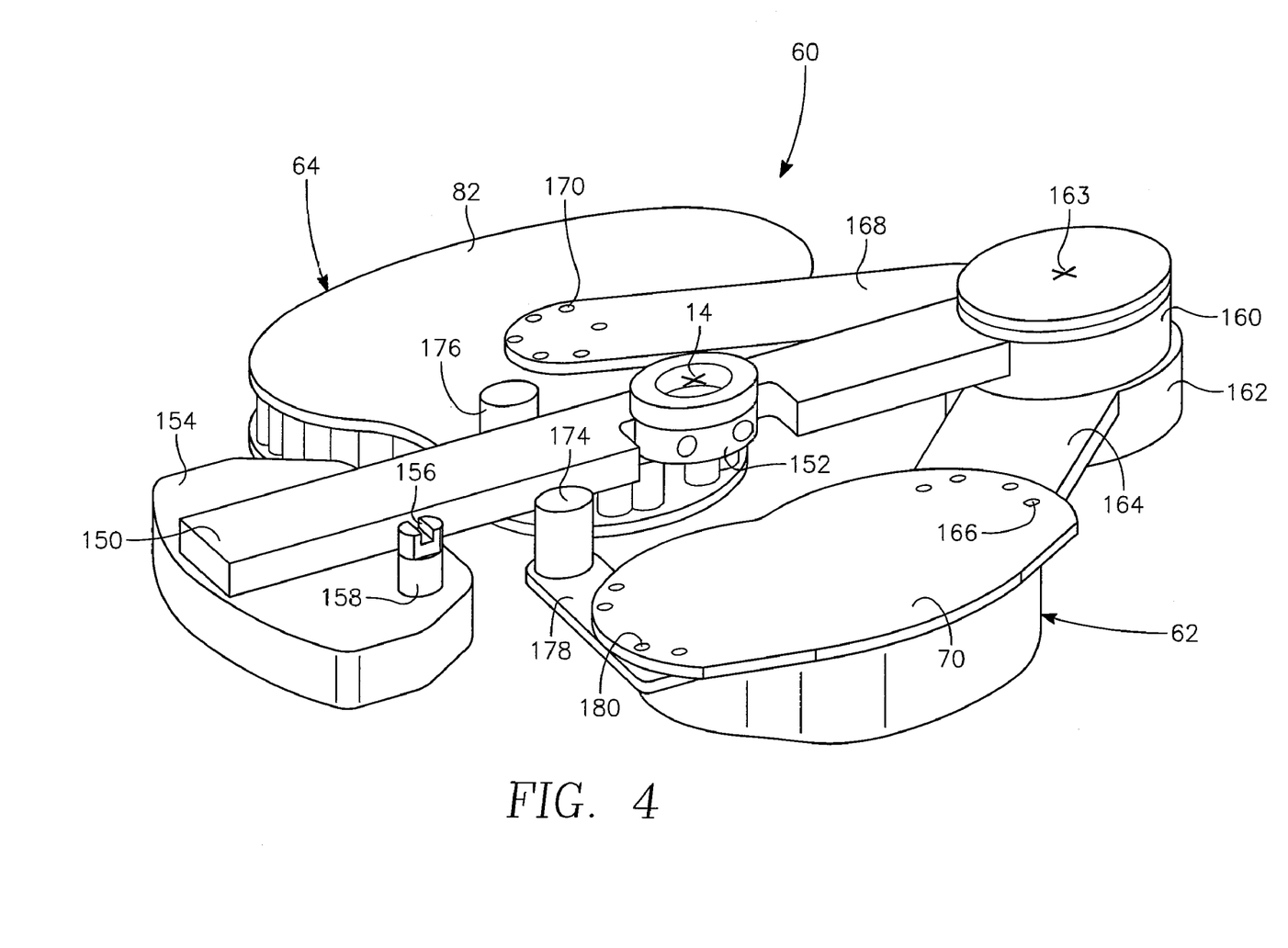
FIG. 4 is an orthographic view of the magnetron system incorporating the source and auxiliary magnetrons of FIG. 3.

The magnetron system 60 is illustrated in the orthographic view of FIG. 4 generally from above in the operational position. It includes a cross arm 150 fixed at its center to the rotary shaft 94 by a clamp 152. One end of the cross arm supports a counterweight 154 including a horseshoe magnet 156 on top of a post 158 to allow external magnetic monitoring of the rotation of the magnetron system 60 about the rotation axis 14. The other end of the cross arm 150 across the rotation axis 14 supports a rotation bearing 160 rotatably supporting an L-shaped link 162 for rotation about an offset vertical pivot axis 163. The link 162 includes a first arm 164 fixed by screws 166 to an extended side portion of the support yoke 70 of the source magnetron 62. The link 162 also includes a second arm 168 extending approximately perpendicularly to the first arm 164 from the offset rotation axis 163. The second arm 168 is fixed by screws 170 to a central portion of the support yoke 82 of the auxiliary magnetron 64. The link 162 including the arms 164, 168 act as a swing member supporting the two magnetrons 62, 64 and pivoting them about the pivot axis 163.

The illustrated configuration of the swing member causes the magnetrons 62, 64 to swing in different and complementary radial directions with respect to the rotation center 14. The complementary motion arises because the source axis between the center of the source magnetron 62 and the pivot center 163, generally following the first arm 164, lies on one side of the pivot arm extending between the rotation center 14 and the pivot axis 163, generally following the cross arm 150, while the auxiliary axis between the center of the auxiliary magnetron 64 and the pivot center 163, generally following the second arm 168, lies on the other side of the pivot arm. The magnetron centers may be defined as the center of geometrical center of gravity for an area with a periphery following the centerline of the gap between the opposed poles of the magnetron. Typically, however, the center is approximated by any point inside the outer periphery of the inner pole.

The magnetron system 60 is immersed in the cooling bath 102 at the back of the target 18 and its magnetrons 62, 64 are closely spaced from the electrically conductive target 18. As a result, as the rotary shaft 94 rotates the magnetrons 62, 64 in either direction about the rotation axis 14, both a hydraulic drag from the viscous liquid of the cooling bath 102 and magnetic eddy current induced by the magnetrons 62, 64 in the conductive target 18 tend to impede the rotation. As a result of hydraulic drag and eddy currents, which act in the same circumferential direction, during rotation of the magnetron system 60 about the central axis 14, the magnetrons 62, 64 experience an impeding force in the direction opposed to the rotation direction which develops a rotation moment about the pivot axis 163 and causes the link 162 to rotate about the pivot axis 163. The hydraulic drag is greatest when the rotary shaft 94 is starting rotation or changing direction but probably never disappears as the bath 102 begins to swirl together with the magnetron system 60 since cooling water is being replenished. The eddy current does not significantly decrease over rotation time. There is some contribution from centrifugal force, but it is relatively small because of the similar weights and moment arms of the two magnetrons 62, 64. The geometry of the link 162 and its supported magnetrons 62, 64 causes one of the magnetrons 62, 64 to move toward the central axis 14 and the other to move away. The inward motion of one magnetron and hence the outward motion of the other magnetron are limited by a two bumpers 174, 176, alternatively called stops, which are stopped from respective further inward motion by engaging opposed sides of the cross arm 150. The first bumper 174 is fixed to an arm 178 fixed by screws 180 to another extended portion of the yoke support 70 of the source magnetron 62 while the second bumper 176 is fixed to the support yoke 82 of the auxiliary magnetron 64.

Figure 5:
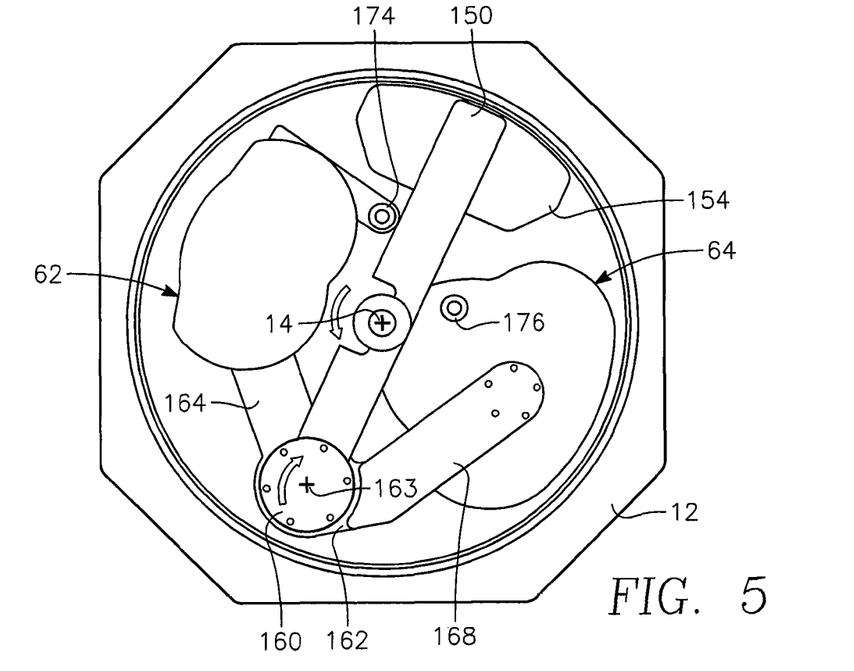
FIG. 5 is a plan view of the source and auxiliary magnetrons in their sputter deposition positions.

The switching between the two positions is effected by the computer-controlled motor 96 reversing the direction of rotation of the rotary shaft 94 about the rotation axis 14 and hence of the entire magnetron system 60 about the rotation axis 14. As illustrated in the top plan view of FIG. 5, when the rotary shaft 94 rotates the cross arm 150 in the counter clockwise direction about the rotation axis 14, the impeding forces cause the link 162 and its arms 164, 168 to rotate in the clockwise direction about the pivot axis 163 until the bumper 174 fixed to the source magnetron 62 engages one side of the cross arm 150. In this processing configuration, the source magnetron 62 is disposed at its radially inward position away from the chamber wall 12, the grounded shield 24, and the plasma dark space 50 so that the source magnetron 62 can support a plasma for sputter deposition or sputter etching of the wafer 20. Also in this processing configuration, the auxiliary magnetron 64 is disposed at its radially outward position near the chamber wall 12 so that its plasma track is drained through the plasma dark space or grounded to the shield 24. Thus, the auxiliary magnetron 64 in its radially outer position cannot support a significant plasma.

Figure 6:
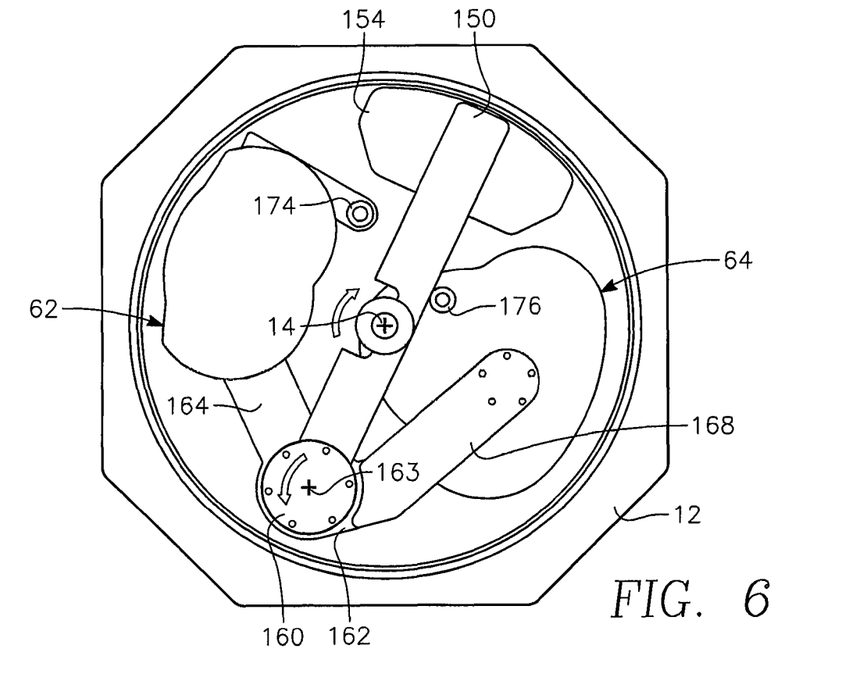
FIG. 6 is a plan view of the source and auxiliary magnetrons in their target cleaning positions.

However, as illustrated in the top plan view of FIG. 6, when the rotary shaft 94 rotates the cross arm 150 in the clockwise direction about the rotation axis 94, the impeding forces cause the link 162 and its arms 164, 168 to rotate in the counter clockwise direction about the pivot axis 163 until the bumper 176 fixed to the auxiliary magnetron 64 engages the other side of the cross arm 150. In this cleaning configuration, the auxiliary magnetron 64 is disposed at its inward direction away from the chamber wall 12 and the electrical grounding elements so that the auxiliary magnetron 64 is able to support a plasma, at least at higher chamber pressures, and to clean the target. Further, at the inward position, the large auxiliary magnetron 64 extends over a large area including near to the target center 14, thereby providing effective cleaning of the large central portion of the target 18. On the other hand, in this cleaning configuration, the source magnetron 62 is disposed at its outward position near the chamber wall 12, the grounded shield 24, and the plasma dark space 50. As a result, the source magnetron 62 is much less efficient at supporting a plasma so that it is not significantly sputtering and eroding the target 18 during the cleaning phase.

The processing mode is typically performed at low chamber pressures which promote high ionization fractions in the area of the target adjacent the source magnetron 62 in its inner position. At such low pressures, the auxiliary magnetron 64 may not be able to support a plasma even apart from its electrical grounding at its outer position. As a result, it is not even required that the auxiliary magnetron be grounded out during the processing mode. However, as pointed out previously, reactive sputtering of TaN or TiN is typically performed at higher chamber pressures for which the auxiliary magnetron 64 may support a plasma. In the interest of concentrating the target power at the source magnetron 62 during processing, it is thus desired to actively short out auxiliary magnetron 64. When supporting a plasma or not, the auxiliary magnetron 64 is producing an auxiliary magnetic field which acts to guide sputter ions generated near the source magnetron 62. If the outer poles of both magnetrons have the same polarity, as they are illustrated in FIGS. 1 and 3, during the processing mode the auxiliary magnetron acts to repel ions away from the target center 14. As Tang et al. explain in U.S. provisional application 60/849,730, filed Oct. 5, 2006, which has been subsequently filed as U.S. patent application Ser. No. 11/689,720 on Mar. 22, 2007 and published as U.S. patent application publication 2008/0083610, use of the small offset source magnetron alone tends to result in center-heavy sputter deposition and sputter etching. The repulsion produced by the auxiliary magnetron even when not supporting a plasma advantageously improves radial uniformity of sputter deposition and sputter etching otherwise mostly generated by the source magnetron. However, the two magnetrons may have opposed polarities of their outer poles for other applications. The relative polarity of the auxiliary magnetron depends on the process requirement of the source magnetron in providing an auxiliary field improving the uniformity, whether for sputter deposition or sputter etching.

Although the described embodiment rigidly links radial movements of the two magnetrons, other embodiments may allow separate control of their respective radial movements.

Although the described embodiment relied upon reversal of the rotary direction to effect a change in the radial positions of the two magnetrons, other types of control are possible including centrifugal variable-speed control, as described by Miller et al., or one or more actuators providing positive radial movement either for joint movement of the two magnetrons or for separately controlled movement of them. A simple form of mechanical position control for the complementary movement of the two magnetrons 62, 64 of FIG. 4 couples an externally controlled mechanical actuator between the cross arm 150 and one of the link arms 164, 168 with the possible addition of a similarly arranged bias spring acting in the opposed pivoting direction. Thereby, the magnetron position may be quickly controlled independently of the rotation direction and rate.

The invention thus allows advanced sputter deposition performance and efficient target cleaning with little impact on throughput and a relatively simple and inexpensive upgrade in the sputtering apparatus.

The invention claimed is:

1. A magnetron system for use adjacent a target in a plasma sputter chamber, comprising:
    a pivot arm configured for fixing to a rotary shaft extending along a rotation axis;
    a swing member rotatably mounted on the pivot arm at a pivot axis displaced away from the rotation axis;
    a first magnetron supported at a first position on the swing member; and
    a second magnetron having a different configuration than the first magnetron supported at a second position on the swing member, wherein the first magnetron includes an outer first magnetic pole of a first magnetic polarity, having a first total magnetic intensity and an inner second magnetic pole of an second magnetic polarity opposed to the first magnetic polarity, having a second total magnetic intensity, surrounded by the first magnetic pole, and separated therefrom by a first gap;
    wherein a rotation in one direction of the swing member causes the first magnetron to move away from the rotation axis and the second magnetron to move towards the rotation axis, wherein the second magnetron includes an outer third magnetic pole of a third magnetic polarity, having a third total magnetic intensity and an inner fourth magnetic pole of a fourth magnetic polarity opposed to the third magnetic polarity, having a fourth total magnetic intensity, surrounded by the third magnetic pole, and separated therefrom by a second gap.

2. The system of claim 1, wherein the first position is located on one side of the arm and the second position is located on an opposed second side of the arm.

3. The system of claim 2, further comprising first and second bumpers fixed to the pivoting member on opposed sides of the arm and engageable with the arm when the swing member pivots about the pivot axis.

4. The system of claim 1, wherein the first and third magnetic polarities extend in a same direction.

5. The system of claim 1, wherein the first gap is smaller than the second gap.

6. The system of claim 1, wherein an area encompassed by an outer periphery of the first magnetic pole is less than an area encompassed by an outer periphery of the third magnetic pole.

7. The system of claim 1, wherein a ratio of the first to the second total magnetic intensities is greater than a ratio of the third to the fourth total magnetic intensities.

8. The system of claim 1, wherein:
    the first and third magnetic polarities extend in a same direction;
    the first gap is smaller than the second gap;
    an area encompassed by an outer periphery of the first magnetic pole is less than an area encompassed by an outer periphery of the third magnetic pole; and
    a ratio of the first to the second total magnetic intensities is greater than a ratio of the third to the fourth total magnetic intensities.

9. A plasma sputtering system, comprising:
    a vacuum chamber body arranged around a central axis, containing a support for a substrate to be processed and configured to be sealed with a target;
    a rotary shaft arranged along the central axis;
    a first magnetron rotated by the rotary shaft and being displaceable radially with respect to the central axis, wherein the first magnetron includes an outer first magnetic pole of a first magnetic polarity, having a first total magnetic intensity and an inner second magnetic pole of an second magnetic polarity opposed to the first magnetic polarity, having a second total magnetic intensity, surrounded by the first magnetic pole, and separated therefrom by a first gap; and
    a second magnetron having a different configuration than the first magnetron, rotated by the rotary shaft, and being displaceable radially with respect to the central axis, wherein the second magnetron includes an outer third magnetic pole of a third magnetic polarity, having a third total magnetic intensity and an inner fourth magnetic pole of a fourth magnetic polarity opposed to the third magnetic polarity, having a fourth total magnetic intensity, surrounded by the third magnetic pole, and separated therefrom by a second gap;
    wherein the first and second magnetrons are linked to move in complementary radial directions.

10. The system of claim 9, wherein each of the magnetrons more effectively supports a plasma at respective radially inner positions and less effectively supports a plasma at respective radially outer positions.

11. The system of claim 9, wherein the first and third magnetic polarities extend in a same direction.

12. The system of claim 9, wherein the second and third fourth magnetic polarities extend in a same direction.

13. The system of claim 9, wherein the first gap is smaller than the second gap.

14. The system of claim 9, wherein an area encompassed by an outer periphery of the first magnetic pole is less than an area encompassed by an outer periphery of the third magnetic pole.

15. The system of claim 9, wherein a ratio of the first to the second total magnetic intensities is greater than a ratio of the third to the fourth total magnetic intensities.

16. The system of claim 9, wherein:
an area encompassed by an outer periphery of the first magnetic pole is less than an area encompassed by an outer periphery of the third magnetic pole;
a ratio of the first to the second total magnetic intensities is greater than a ratio of the third to the fourth total magnetic intensities.

17. A sputtering method performed in a sputter chamber arranged about a central axis and having a target in opposition to a support for a substrate, comprising:
in a first mode of operation, rotating about the a central axis in back of the target a first center of a first magnetron at a first radius and a second center of a second magnetron of different magnetic configuration than the first magnetron at a second radius, wherein the first magnetron includes an outer first magnetic pole of a first magnetic polarity, having a first total magnetic intensity and an inner second magnetic pole of an second magnetic polarity opposed to the first magnetic polarity, having a second total magnetic intensity, surrounded by the first magnetic pole, and separated therefrom by a first gap and the second magnetron includes an outer third magnetic pole of the first magnetic polarity, having a third total magnetic intensity and an inner fourth magnetic pole of the second magnetic polarity opposed to the third magnetic polarity, having a fourth total magnetic intensity, surrounded by the third magnetic pole, and separated therefrom by a second gap smaller than the first gap; and
in a second mode of operation, rotating about the central axis in back of the target the first center of the first magnetron at a third radius greater than the first radius and the center of the second magnetron at a fourth radius less than the second radius.

18. The method of claim 17, wherein in the first mode a production substrate is disposed on the support to be sputter processed and in the second mode no production substrate is disposed on the support while the target is cleaned.

19. The method of claim 17, wherein the first magnetron more effectively supports a plasma within the chamber in the first mode than in the second mode and the second magnetron more effectively supports a plasma within the chamber in the second mode than in the first mode.

20. The method of claim 17, wherein the first and second magnetrons are mounted on respective first and second arms of a swing plate pivoting about a pivot point on a pivot arm fixed to a rotary shaft extending along the central axis, wherein the first and second arms are disposed on opposed sides of the pivot arm.

21. The method of claim 20, wherein, in the first mode, the rotary shaft is rotated in first rotary direction and, in the second mode, the rotary shaft is rotated in an opposed second rotary direction.

22. The system of claim 1, wherein the first and second magnetrons are mounted on respective first and second aims of the swing member pivoting about the pivot axis, wherein the first and second arms are disposed on opposed sides of the pivot arm.

23. The system of claim 9, wherein the first and second magnetrons are mounted on respective first and second arms of a swing plate pivoting about a pivot point on a pivot arm fixed to the rotary shaft, wherein the first and second arms are disposed on opposed sides of the pivot arm.

24. The system of claim 10, further comprising a grounded shield in the vacuum chamber arranged around the central axis in an axial space between the support and the target, wherein a plasma track of at least one of the magnetrons is grounded to the shield when disposed at its respective radial position.

25. The method of claim 17:
wherein, in the first mode of operation, a plasma track of the second magnetron is grounded to a grounded shield arranged about the central axis in an axial space between the target and the support, and
wherein, in the second mode of operation, a plasma track of the first magnetron is grounded to the grounded shield.

* * * * *

UNITED STATES PATENT AND TRADEMARK OFFICE
CERTIFICATE OF CORRECTION

| | | |
|---|---|---|
| PATENT NO. | : 7,767,064 B2 | Page 1 of 1 |
| APPLICATION NO. | : 11/553880 | |
| DATED | : August 3, 2010 | |
| INVENTOR(S) | : Pavloff et al. | |

It is certified that error appears in the above-identified patent and that said Letters Patent is hereby corrected as shown below:

Col. 10, line 61, delete "fourth"

Col. 11, lines 28-29, delete "opposed to the third magnetic polarity"

Signed and Sealed this

Thirty-first Day of January, 2012

David J. Kappos
*Director of the United States Patent and Trademark Office*